(12) United States Patent
Adams

(10) Patent No.: US 6,956,425 B2
(45) Date of Patent: Oct. 18, 2005

(54) CLAMPING CIRCUIT FOR HIGH-SPEED LOW-SIDE DRIVER OUTPUTS

(75) Inventor: Reed W. Adams, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/798,150

(22) Filed: Mar. 10, 2004

(65) Prior Publication Data

US 2005/0140420 A1 Jun. 30, 2005

Related U.S. Application Data

(60) Provisional application No. 60/533,152, filed on Dec. 30, 2003.

(51) Int. Cl.[7] .............................................. H03K 5/08
(52) U.S. Cl. ...................................... 327/309; 327/427
(58) Field of Search ........................ 327/110, 309–310, 327/312–314, 318–328, 389, 404–405, 419, 327/421, 427, 432, 434, 437, 482, 493, 502, 327/504, 574, 581, 583, 584; 361/91.5–91.6

(56) References Cited

U.S. PATENT DOCUMENTS

| | | | |
|---|---|---|---|
| 5,532,635 A | * | 7/1996 | Watrous et al. .............. 327/310 |
| 5,608,595 A | * | 3/1997 | Gourab et al. ................. 361/79 |
| 5,793,232 A | * | 8/1998 | Gallinari et al. ............. 327/110 |
| 5,838,526 A | * | 11/1998 | Ishikawa et al. ............ 361/118 |
| 6,169,439 B1 | | 1/2001 | Teggatz et al. ............. 327/309 |
| 6,614,633 B1 | * | 9/2003 | Kohno ......................... 361/56 |

* cited by examiner

*Primary Examiner*—My-Trang Nu Ton
(74) *Attorney, Agent, or Firm*—William B. Kempler; W. James Brady, III; Frederick J. Telecky, Jr.

(57) ABSTRACT

A clamp for a FET switch utilizes a surge detector to turn off one of two bias circuits for the FET. The first biasing circuit provides the current necessary for high speed switching. The second biasing circuit provides a lower biasing current. A resistor or other device is used to allow the measurement of BVdss on the integrated circuit where the surge detector is connected from a terminal of the conductive path of the FET to the gate thereof. The switching circuit allows the surge detector to turn on the FET to act as a self-clamp when there is a spike in the voltage applied to the FET, such as when turning off an inductive load.

19 Claims, 2 Drawing Sheets

CLAMPING CIRCUIT FOR HIGH-SPEED LOW-SIDE DRIVER OUTPUTS

This application claims benefit of provisional No. 60/533,152 filed Dec. 30, 2003.

BACKGROUND OF THE INVENTION/FIELD OF THE INVENTION

The present invention relates generally to a clamping circuit for a switch FET transistor and more particularly a clamping device for a switch FET coupled to a control solenoid of an ABS braking system for an automobile.

Power FETs are widely used in the automotive industry and are utilized to drive the solenoid valves in antilock brake systems (ABS), for example. In designing power FETs for use with inductive loads, it is common to utilize two techniques to protect the FET from the voltage spike created when power is suddenly switched off in an inductor. FIG. 1 shows such a circuit generally as 100. The inductor 104 is coupled between a source of power 102 and a power FET 106 which is also coupled to ground. The gate of the FET is coupled to a node 126 which is coupled to current source 122 via switch 124 which is also coupled to a source of positive power 120. Node 126 is further coupled to a current sink 128 which is coupled to ground 132 via switch 130. The current flowing through the current sink 128 and the gate capacitance determines the speed in which the transistor can be turned off. In addition, node 110 is coupled between the inductor and the drain of transistor 106 and it has a reverse breakdown diode 112 and a forward diode 114 coupled between the drain and node 126 which is coupled to the gate of the FET. The breakdown voltage of the diode 112 and the forward voltage drop of diode 114 are chosen so that the FET 106 can be driven into conduction before the drain voltage reaches the avalanche voltage of the power FET. This causes the FET to act as a clamp and protect itself against the damage that would be created when it enters the avalanche mode. The FET device is able to dissipate the stored inductive energy without the use of external circuits and without damage to the FET.

A circuit of this type, which includes a current limiting circuit for the current through the power FET is shown in the U.S. Pat. No. 6,169,439, for example.

In certain ABS braking systems, it is desirable to pulse width modulate the signal to the solenoid in order to control the antilock function. In order to be able to switch at the speed required for the pulse width modulation control of the solenoid, the slew rate control to prevent the inductive spike cannot be used. Currently, these circuits use discrete power FETs and the discrete clamp diode devices to meet this requirement. It is desirable to integrate the FETs in order that a plurality of FETs be available in a single package which will be available at a reduced price and which will reduce the manufacturing costs for the printed circuit board. One problem is that it is necessary to measure the BVdss of the device in order that it meet reliability requirements and will not fail in normal operation. One way to perform this test is to add a resistor in series with the diodes 112, 114. The slope of the line on a curve tracer is then determined by the resistance value, which will go to essentially zero when the transistor enters the avalanche breakdown mode. Adding a series resistor, however, reduces the current flow through the clamping diode so that it may not provide enough current under certain test conditions to turn the transistor on to act as a self clamp. This could be overcome by reducing the value of the series resistor, but this increases the current flow through the clamping diode, and requires that the size of the diodes be increased. As will be shown later in connection with FIG. 2, it is common to have more than the two diodes shown in FIG. 1 in the diode chain. Therefore, all the diodes of the chain would have to be increased in size, which unnecessarily uses the valuable real estate on the integrated circuit chip. A typical series resistor would be 10K ohms, for example. In order to have the circuit turn on the power FET to clamp the voltage below its avalanche voltage, the series resistance might have to be reduced to 100 ohms, for example. This would require a doubling of the area of the diodes in the clamping diode chain.

SUMMARY OF THE INVENTION

It is a general object of the present invention to provide an improved voltage clamp for an FET transistor.

This and other objects and features are provided, in accordance with one aspect of the invention by a FET switch having a clamp circuit comprising a FET switching transistor. A surge detector is coupled between a conductive path of the FET switching transistor and a gate thereof, the surge detector having means for enabling the measurement of BVdss of the FET switching transistor. A first biasing circuit is coupled to the gate of the FET switching transistor and provides a first biasing current to the gate. A second biasing current is coupled to the gate of the FET switching transistor and provides a second biasing current to the gate, the second biasing current being less than the first biasing current. A biasing switching circuit is coupled to the first biasing circuit to disconnect the flow of the first biasing current when a voltage surge is detected by the surge detector, whereby the surge detector can turn on the FET switching transistor to clamp the surge voltage below the BVdss thereof.

Another aspect of the invention includes in an ABS braking system, an FET switch for PWM the current through a control solenoid comprising a FET switching transistor having a conductive path coupled to the solenoid at a node. A reverse voltage breakdown diode and a series resistor being coupled between the node and a gate of the FET switching transistor. A detector responsive to current flow through the reverse breakdown diode to generate a surge control signal. A first biasing current source coupled to the gate, the first biasing current source enabling the FET switching transistor to be turned off fast enough to generate a voltage surge at the node caused by the inductance of the control solenoid, the surge exceeding the BVdss of the FET switching transistor. A second biasing current source is coupled to the gate, the second current source biasing current. A biasing current switching circuit coupled to the first biasing circuit to disconnect flow of first biasing current in response to the surge control signal.

A further aspect of the invention includes a clamp circuit comprising a reverse breakdown diode and a resistor coupled in series thereto and coupled between a load and a gate of a FET transistor. A surge detector coupled to the reverse breakdown diode and responsive to current flow therein. A first switchable current source coupled to the gate providing a first biasing current and responsive to an output signal from the surge detector. A second current source coupled to the gate providing a second biasing current less than the first biasing current, whereby the detection of a surge by the surge detector disconnects the first biasing current to allow the current flowing through the reverse breakdown diode to turn on the FET transistor to clamp the surge voltage below the BVdss thereof.

DETAILED DESCRIPTION OF THE PRESENT INVENTION

Figure 2:
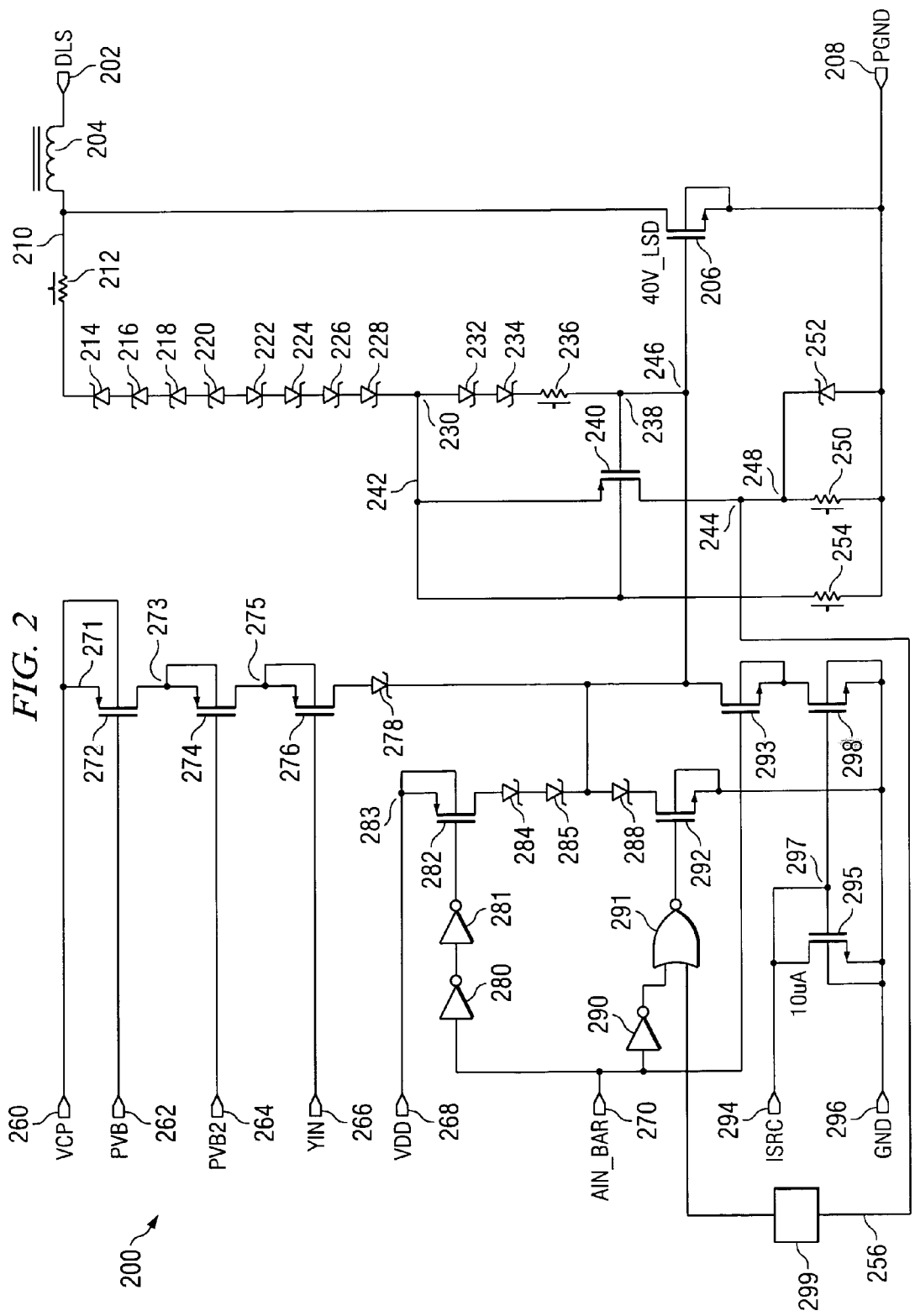
FIG. 2 is a schematic diagram of a clamp circuit according to the present invention.

FIG. 2 shows a schematic diagram of a clamp circuit according to the present invention generally as 200. The coil 204 of the control solenoid for an ABS braking system is connected to a positive battery voltage 202 at one terminal and connected to the drain of NMOS FET 206 at the other terminal. The other terminal is also connected via line 210 to a string of zener diodes 214, 216, 218, 220 and string of forward biased diodes 222, 224, 226, 228, 232 and 234. In series with the string of diodes is the resistor 212 which can be, for example, 10K ohms. Also inserted in this string of diodes is a second resistor 236 which has its distal end coupled to the gate of PMOS transistor 240 at node 238. Node 238 is connected to the gate of FET 206 at 246. The number of zener diodes 214, 216, 218 and 220 is a design choice based upon the breakdown voltages of standard parts used in a particular integrated circuit and the breakdown voltage of the FET 206 which determine the clamping voltage. The forward biased diodes 222, 224, 226, 228, 232 and 234 may be the same as diodes 214–220 but turned in the opposite direction to act as forward biased diodes. As is known to those skilled in the art, the forward bias diodes provide temperature compensation for the zener diodes and prevent a reverse flow of current from the gate through the FET 206, when the FET is turned on. The source of FET 206 is connected to power ground 208. The source of PMOS 240 is connected to the node 230 between forward biased diodes 228 and 232. Thus the gate to source voltage to drive transistor 240 on is developed across forward biased diodes 232 and 234 and resistor 236. Node 230 is coupled via line 242 and resistor 254 to power ground 208. The drain of transistor 240 is coupled to power ground via a series resistor 248 and a zener diode 252 which is parallel to resistor 248. The drain of transistor 240 is also coupled via line 244 to one input of two input NOR gate 291 via detector circuit 299. The detector circuit 299 may be a Schmitt trigger, buffer circuit or similar circuit, as is well known to those skilled in the art.

Terminal 260 is coupled to a regulated 12 volt source, for example, within the integrated circuit so that the device can be connected to either 12 volt or 42 volt automotive battery systems. The source of PMOS transistor 272 is coupled to pin 260 via line 271. The drain of transistor 272 is coupled via line 273 to the source of transistor 274 and the drain of transistor PMOS 274 is coupled via line 275 to the source of transistor PMOS 276. Pin 262 is coupled to the gate of transistor 272 and pin 264 is coupled the gate of transistor 274. Each of these pins is coupled to a bias source in order to generate a constant current mirror circuit sourcing a current level of 10 microamps, for example. Pin 266 is coupled to a logic signal that swings from 0 volts to the preregulated voltage on pin 260, which may be a 0–12 volt logic signal, for example. This signal is used to switch transistor 276 to apply a signal generated by the constant current source transistors 272, 274 to the gate transistor 206. This signal may be a 12 volt signal, for example. The use of the higher gate voltage allows the Rdson of the FET 206 to be reduced, thus reducing the area of the transistor; in this example by up to about 40%. Diode 278 is coupled between the drain of transistor 276 and node 246. Diode 278 prevents reverse flow of current when the gate voltage is raised to 18 volts during overdrive testing of the device.

Pin 268 is coupled to a regulated internal logic level voltage, which may be a 5 volt or 3.3 volt power supply, for example, which is coupled to the source of PMOS transistor 282 via line 283. Pin 270 is coupled to a 0–5 volt logic level signal which when it is in the 0 volt state, will turn on power FET 206. The signal of pin 270 is buffered by inverters 280 and 281 and is applied to the gate of PMOS transistor 282. The drain of transistor 282 is coupled via forward biased diodes 284 and 285 to node 246. Node 246 is coupled via forward biased diode 288 to the drain of NMOS transistor 292. The input logic signal on pin 270 is coupled via inverter 290 to one input of 2 input NOR gate 291. The output of NOR gate 291 is coupled to the gate of transistor 292. The other input to 2 input NOR gate 291 is line 256 coming from transistor 240 via detector circuit 299. The detector circuit 299 is located between node 244 and 1 input of 2 input NOR gate 291 to prevent jitter in the output signal from transistor 240 from causing the protective circuit to switch into and out of the clamping mode. The source of transistor 292 is coupled to circuit ground 296. The signal on pin 270 is also coupled to the gate of NMOS transistor 293, the drain of which is coupled to node 246. The source of transistor 293 is coupled to the drain of NMOS transistor 298, the source of which is grounded to circuit ground 296. The gate of transistor 298 is coupled to the gate of NMOS transistor 295 which is diode connected to pin 294 by line 297. Pin 294 receives an input bias current of 10 microamps, for example. The ratio of sizes of transistors 298 to transistor 295 is 8 to 1, so that an input current of 10 microamps through transistor 295 generates a current of 80 microamps, for example, through transistor 298. This allows the clamp circuit to operate against the current through transistor 298 when transistor 292 is turned off.

In operation, the 5 volt logic signal on line 270 causes transistor 206 to turn on when it is at substantially 0 volts. This causes current to flow through the coil 204 of the solenoid of the ABS braking system. While the FET 206 is turned on, a 0 volt signal can be applied on pin 266 to provide a 10 micoramp charging current, for example, to charge the gate capacitance of FET 206 up to the pre-regulated voltage of 12 volts, for example. This reduces the Rdson of FET 206, which allows the utilization of a transistor which is much smaller, 40% smaller, for example, than without this additional boost voltage. The 0 volt signal on pin 270 causes a 0 volt level to be applied to the gate of transistor 282 and a 0 volt level to be applied to the gate of transistor 292. This generates a positive voltage at the gate of transistor 206 to turn the FET 206 on.

When the power FET 206 is to be turned off, the signal on pin 266 goes to 12 volts to turn off transistor 276 and remove the 12 volt boost from the gate of FET 206. The signal 270 goes to substantially 5 volts which places a high voltage on the gate of transistor 282, turning that transistor off. The 5 volt signal is inverted by inverter 290 and applied to one input of 2 input NOR gate 291. Thus, the NOR gate 291 will be controlled by the second input, which comes from the output of clamping detection transistor 240 via detector circuit 299. If the clamping circuit is inactive, node 244 will be pulled to ground via resistor 250 and the output of detector circuit 299 will be a logic low applied to the second input of 2 input NOR gate 291. The resulting high signal is applied to the gate of NMOS transistor 292. This will pull node 246 for switching FET 206 towards ground and the forward voltage drop across forward biased diode 288. The 5 volt logic signal on pin 270 will also turn NMOS transistor 293 on to couple the 80 microamp current mirror sink to node 246, but this is shorted by the action of transistor 292.

As the magnetic field across inductor 204 collapses, the voltage on line 210 will increase until it reaches the clamp voltage of the string of zener diodes 214–220 plus the forward voltage drops of diodes 222–234. This will generate a gate voltage on transistor 240 caused by the forward voltage drops across diodes 232, 234 and resistor 238. When this voltage drop is sufficient to turn transistor 240 on, it will generate a positive signal at node 244, which will be fed to the input of detector circuit 299 by line 256. The output of detector circuit 299 will also be a positive voltage, which will then cause the output of 2 input NOR gate 291 to go to 0, and turn off transistor 292. This will allow the current flowing through the diode chain 214, 216 . . . 234 and resistors 212 and 236 to raise the voltage on the gate of FET 206 to turn the FET transistor on. The conducting FET transistor 206 will clamp the output voltage at a safe voltage for the FET thus providing a self-clamp circuit and protect the FET from damage from the high voltage due to the collapsing magnetic field of inductor 204. Once transistor 292 has been turned off, the 80 microamp current sink provided by transistor 298 will tend to pull node 246 toward ground and allow the action of the diodes to regulate whether the switching FET 206 is to be turned on or off.

Figure 1:
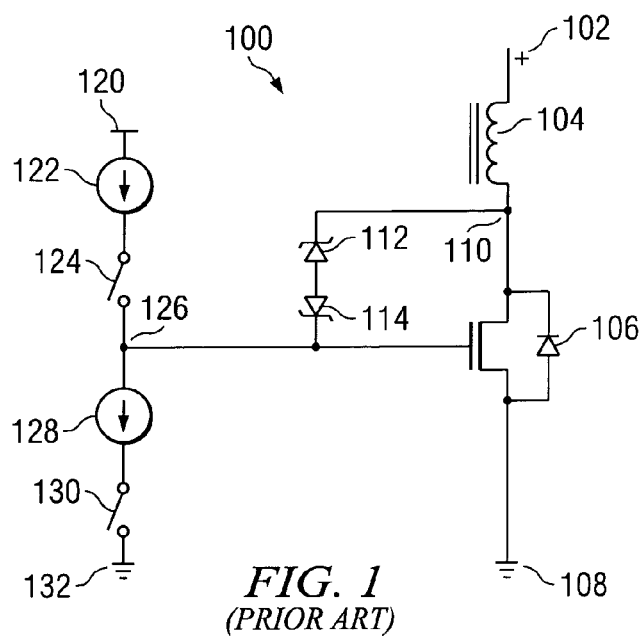
FIG. 1 is a schematic drawing of a conventional clamp circuit for a power FET.
Figure 3:
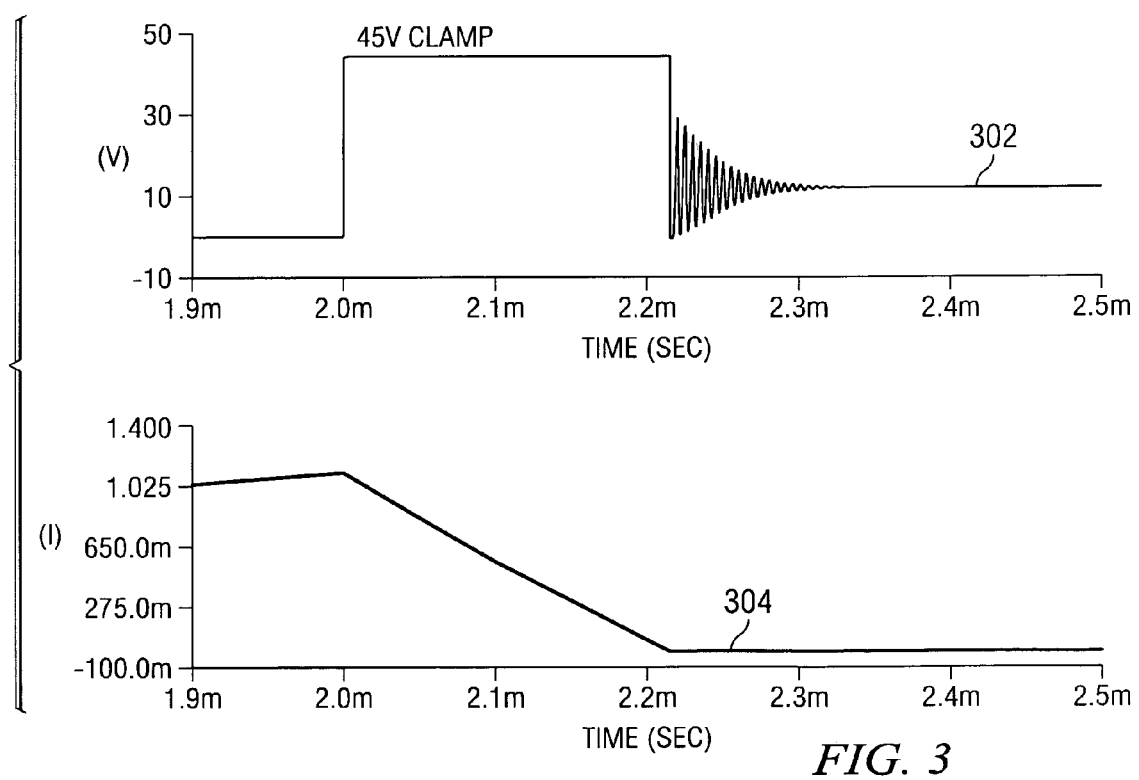
FIG. 3 is the current and voltage waveforms for simulation of the circuit of FIG. 2.

FIG. 3 illustrates the drain voltage of switching FET 206 as curve 302 and the current through FET 206 as curve 304. As can be seen by curve 304, the current through the inductor increases until FET 206 is turned off. At that point the current through the inductor begins to decrease while the output of voltage rises immediately and would rise above the breakdown voltage of the FET, if no clamp protection were provided. The self clamp action of transistor 206 limits the output voltage to 45 volts, for example, where the output voltage remains until the current through the inductor 204 has collapsed after which the voltage on the drain of transistor 206 goes through a damped oscillation and then returns to the 12 volt power supply level on pin 202. By clamping the voltage at 45 volts, which is below the 60 volt BVdss of FET 206, in this example, damage to the transistor can be prevented.

While the invention has been shown and described with reference to preferred embodiments thereof, it is well understood by those skilled in the art that various changes and modifications can be made in the invention without departing from the spirit and scope of the invention as defined by the appended claims.

What is claimed is:

1. An FET switch having a clamp circuit comprising:
   an FET switching transistor;
   a surge detector coupled between a conductive path of the FET switching transistor and a gate thereof, the surge detector having means for enabling the measurement of BVdss of the FET switching transistor;
   a first biasing circuit coupled to the gate of the FET switching transistor providing a first biasing current to the gate;
   a second biasing current coupled to the gate of the FET switching transistor providing a second biasing current to the gate, the second biasing current being less than the first biasing current; and
   a biasing switching circuit coupled to the first biasing circuit to disconnect the flow of the first biasing current when a voltage surge is detected by the surge detector, whereby the surge detector can turn on the FET switching transistor to clamp the surge voltage below the BVdss thereof.

2. The FET switch of claim 1 wherein the means for enabling the measurement of BVdss is a resistor in series with the surge detector.

3. The FET switch of claim 2 wherein the resistor has a value of substantially 10K ohms.

4. The FET switch of claim 1 wherein the FET switch is coupled to an inductive load.

5. The FET switch of claim 4 wherein the inductive load is a solenoid in an ABS brake system.

6. The FET switch of claim 1 wherein the surge detector comprises a zener diode.

7. The FET switch of claim 6 wherein the surge detector comprises a plurality of zener diodes.

8. The FET switch of claim 6 wherein the surge detector further comprises a diode which prevents reverse conduction through the zener diode.

9. The FET switch of claim 7 wherein the surge detector further comprises a diode which prevents reverse conduction through the plurality of zener diodes.

10. The FET switch of claim 1 wherein the first bias current is substantially 20 ma. and the second bias current is substantially 80 microamps.

11. In an ABS braking system, an FET switch for PWM the current through a control solenoid comprising:
    an FET switching transistor having a conductive path coupled to the solenoid at a node;
    a reverse voltage breakdown diode and a series resistor being coupled between the node and a gate of the FET switching transistor;
    a detector responsive to current flow through the reverse breakdown diode to generate a surge control signal;
    a first biasing current source coupled to the gate, the first biasing current source enabling the FET switching transistor to be turned off fast enough to generate a voltage surge at the node caused by an inductance of the control solenoid, which would exceed a BVdss of the FET switching transistor;
    a second biasing current source coupled to the gate providing a the second current source biasing current; and
    a biasing current switching circuit coupled to the first biasing circuit to disconnect flow of first biasing current in response to the surge control signal.

12. The FET switch of claim 11 wherein the reverse breakdown diode is a zener diode.

13. The FET switch of claim 11 wherein the current flow through the reverse breakdown diode is sufficient to overcome the second current source biasing current to turn on the FET switching transistor to clamp the voltage surge at a voltage below the BVdss of the FET switching transistor.

14. The FET switch of claim 11 wherein the first bias current is substantially 20 ma. and the second bias current is substantially 80 microamps.

15. The FET switch of claim 11 wherein the resistor has a value of substantially 10K ohms.

16. The FET switch of claim 11 wherein the FET switching transistor is a power FET having load current of substantially 5 A.

17. The FET switch of claim 11 wherein the FET switching transistor, the reverse breakdown diode, the resistor, the first and second biasing current sources, the detector and the biasing current switching circuit are all integrated onto an integrated circuit.

18. A clamp circuit comprising:
a reverse breakdown diode and a resistor coupled in series thereto coupled between a load and a gate of an FET transistor;
a surge detector coupled to the reverse breakdown diode and responsive to current flow therein;
a first switchable current source coupled to the gate providing a first biasing current and responsive to an output signal from the surge detector;
a second current source coupled to the gate providing a second biasing current less than the first biasing current, whereby the detection of a surge by the surge detector disconnects the first biasing current to allow the current flowing through the reverse breakdown diode to turn on the FET transistor to clamp the surge voltage below a BVdss thereof.

19. The clamp circuit of claim 18 wherein the FET transistor is a power FET switching transistor and the load is an inductive load.

* * * * *